(12) United States Patent
Tzu

(10) Patent No.: US 9,472,493 B1
(45) Date of Patent: Oct. 18, 2016

(54) HIGH HEAT-DISSIPATION CHIP PACKAGE STRUCTURE

(71) Applicant: Chung Hsing Tzu, Taipei (TW)

(72) Inventor: Chung Hsing Tzu, Taipei (TW)

(73) Assignee: Great Team Backend Foundry Inc. (VG)

( * ) Notice: Subject to any disclaimer, the term of this patent is extended or adjusted under 35 U.S.C. 154(b) by 0 days.

(21) Appl. No.: 14/706,148

(22) Filed: May 7, 2015

(51) Int. Cl.
*H01L 23/495* (2006.01)
*H01L 23/31* (2006.01)

(52) U.S. Cl.
CPC ..... *H01L 23/49568* (2013.01); *H01L 23/3114* (2013.01); *H01L 23/4952* (2013.01); *H01L 23/49513* (2013.01); *H01L 23/49541* (2013.01)

(58) Field of Classification Search
CPC ............... H01L 23/28; H01L 23/3114; H01L 23/3121; H01L 23/3672; H01L 23/4952; H01L 23/49513; H01L 23/49568; H01L 23/49541; H01L 23/49861
See application file for complete search history.

(56) References Cited

U.S. PATENT DOCUMENTS

2007/0296079 A1* 12/2007 Huang ............... H01L 23/3121
257/712

* cited by examiner

*Primary Examiner* — Armando Rodriguez

(57) ABSTRACT

A high heat-dissipation chip package structure for packaging the semiconductor chips is disclosed. A pre-attachment film is adhered on an upper surface of a heat-dissipation plate or a connection plate first and then it is packaged. After packaging, the pre-attachment film is torn off from the upper surface of the heat-dissipation plate or the connection plate. Finally, a metal layer is electroplated on the location of the upper surface of the heat-dissipation plate or the connection plate where the pre-attachment film is torn off so as to improve the fabricating and packaging quality of the semiconductor chips, reduce the cost of cleaning process, and improve the effects of heat dissipation and electrical conductivity.

9 Claims, 3 Drawing Sheets

HIGH HEAT-DISSIPATION CHIP PACKAGE STRUCTURE

FIELD OF THE INVENTION

The present invention relates to a chip package structure, and more particularly to a high heat-dissipation chip package structure for packaging the semiconductor chips. A pre-attachment film is adhered on an upper surface of a heat-dissipation plate or a connection plate first and then it is packaged. After packaging, the pre-attachment film is torn off from the upper surface of the heat-dissipation plate or the connection plate. Finally, a metal layer is electroplated on the location of the upper surface of the heat-dissipation plate or the connection plate where the pre-attachment film is torn off so as to improve the fabricating and packaging quality of the semiconductor chips, reduce the cost of cleaning process, and improve the effects of heat dissipation and electrical conductivity.

BACKGROUND OF THE INVENTION

The conventional semiconductor chip structure is shown as FIG. 1. An adhesive layer 2 is coated on the upper surface of the base 1 and the chip(s) 3 may be adhered on the upper surface of the base via the adhesive layer 2. And then it is packaged by a potting compound 4. This structure is that the lower surface of the base 1 is exposed to the potting compound 4. That is, only the lower surface of the base 1 has better effect of heat dissipation. But the chip 3 has worse effect of heat dissipation due to being packaged in the potting compound 4 so that the chip 3 is easily damaged.

In order to solve the problem of the structure of FIG. 1, another semiconductor chip structure is disclosed, shown as FIG. 2. The adhesive layer 2 is still coated on the upper surface of the base 1 and the chip(s) 3 may be adhered on the upper surface of the base 1. A heat-dissipation plate 5 is attached on the chip 3. Of course, the heat-dissipation plate 5 is attached on the upper surface of the chip 3 via another adhesive layer 2. And then, it may be packaged by the potting compound 4. However, after packaging, there is only the lower surface of the base 1 exposed to the potting compound 4. Although the heat-dissipation plate 5 has the effect of heat dissipation, the chip 3 and the heat-dissipation plate 5 are still packaged in the potting compound 4 and the effect of heat dissipation is not good. After packaging, some operators try to clean the potting compound 4 on the heat-dissipation plate 5 to improve the effect of heat dissipation. However, the potting compound 4 on the heat dissipation plate 5 cannot totally be cleaned and the effect of heat dissipation may be blocked and is still not good enough.

Accordingly, the inventor of the present invention has devoted himself based on his many years of practical experiences to solve this problem.

SUMMARY OF THE INVENTION

The primary object of the present invention is to provide a high heat-dissipation chip package structure for packaging the semiconductor chips. A pre-attachment film is adhered on an upper surface of a heat-dissipation plate or is a connection plate first and then it is packaged. After packaging, the pre-attachment film is torn off from the upper surface of the heat-dissipation plate or the connection plate. Finally, a metal layer is electroplated on the location of the upper surface of the heat-dissipation plate or the connection plate where the pre-attachment film is torn off so as to improve the fabricating and packaging quality of the semiconductor chips, reduce the cost of cleaning process, and improve the effects of heat dissipation and electrical conductivity.

In order to achieve the above object, the foldable cart structure of the present invention may comprise.

Further features and advantages of the present invention will become apparent to those of skill in the art in view of the detailed description of preferred embodiments which follows, when considered together with the attached drawings and claims.

BRIEF DESCRIPTION OF THE DRAWINGS

All the objects, advantages, and novel features of the invention will become more apparent from the following detailed descriptions when taken in conjunction with the accompanying drawings.

DESCRIPTION OF THE PREFERRED EMBODIMENT

Figure 1:
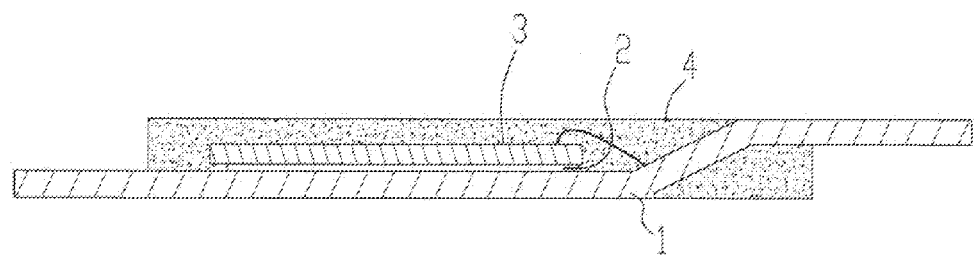
FIG. 1 is an exploded side view of a embodiment of a conventional semiconductor chip structure.
Figure 2:
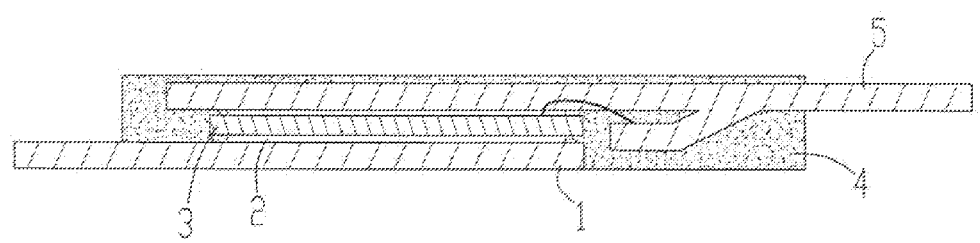
FIG. 2 is an exploded side view of a second embodiment of a conventional semiconductor chip structure.

Referring now to the drawings where like characteristics and features among the various figures are denoted by like reference characters.

Figure 3:
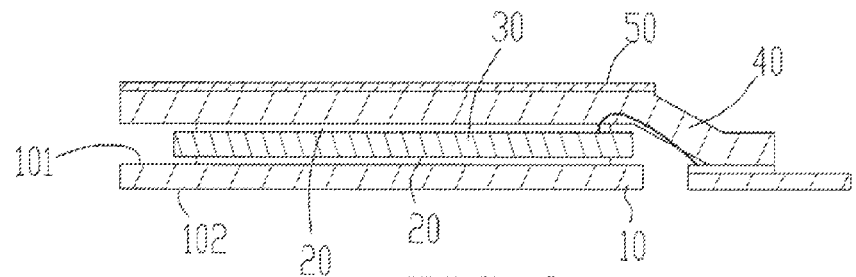
FIG. 3 is an exploded side view of a first embodiment of a semiconductor chip module of a high heat-dissipation chip package structure according to present invention.
Figure 4:
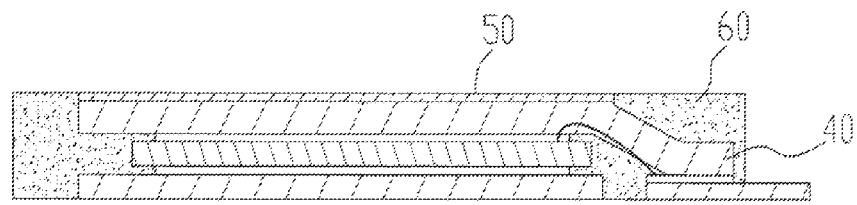
FIG. 4 is an exploded side view of the first embodiment of the semiconductor chip module of the high heat-dissipation chip package structure according to present invention while packaging.
Figure 5:
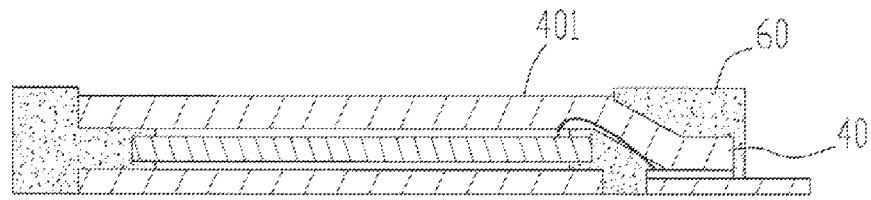
FIG. 5 is an exploded side view of the first embodiment of the semiconductor chip module of the high heat-dissipation chip package structure according to present invention after packaging.
Figure 6:
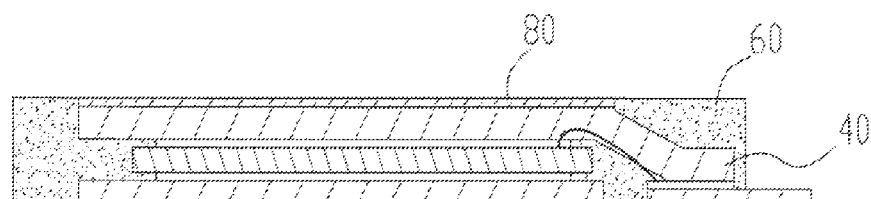
FIG. 6 is an exploded side view of the first embodiment of the high heat-dissipation chip package structure according to present invention after being electroplated by metal.

Please refer to FIGS. 3 to 6, the high heat-dissipation chip package structure of the present invention comprises a base 10, a semiconductor chip 30, a connection plate 40, a pre-attachment film 50, and a potting compound 60.

The base 10 may have an upper surface 101 and lower surface 102 opposite to each other. An adhesive layer 20 may be coated on the upper surface 101 for adhering the semiconductor chip on the base 10.

A bottom part of the semiconductor chip 30 may be adhered on the upper surface 101 of the base 1 via the adhesive layer 20 and a top part of the semiconductor chip 30 may be connected with the connection plate via another one adhesive layer 20.

The connection plate 40 may be electrically connected with the semiconductor chip 30 and a lead frame (not shown). The pre-attachment film 50 may be adhered on a first surface 401 of the connection plate 40. The connection plate 40 may be made by a metal with good conductivity and heat dissipation and selected from one of gold, silver, copper, and aluminum. The pre-attachment film 50 may be a tearable adhesive film and has a predetermined thickness.

A semiconductor chip set is formed after finishing above fabrication. The semiconductor chip set is poured by the potting compound 60 in a mold so as to be packaged a semiconductor chip module. The pre-attachment film 50 has adhered on the first surface 401 of the connection plate 40 before packaging and the pre-attachment film 50 is torn off and the potting compound 60 at a location of the pre-attachment film 50 on the first surface 401 of the connection plate 40 is taken away after packaging so that the location of the first surface 401 of the connection plate 40 without the potting compound 60 has been exposed and an opening is formed thereof due to the predetermined thickness of the pre-attachment film 50. In order to keep electrical connection and aesthetics of the first surface 401 of the connection plate 40, a metal layer 80 may be coated on the first surface 401 of the connection plate 40 so that the semiconductor chip module may be flat and the first surface 401 of the connection plate 40 may be protected. Simultaneously, the connection plate 40 or the metal layer 80 is not covered by the potting compound 60 so that the heat of the semiconductor chip module may be dissipated upwardly and downwardly.

Figure 7:
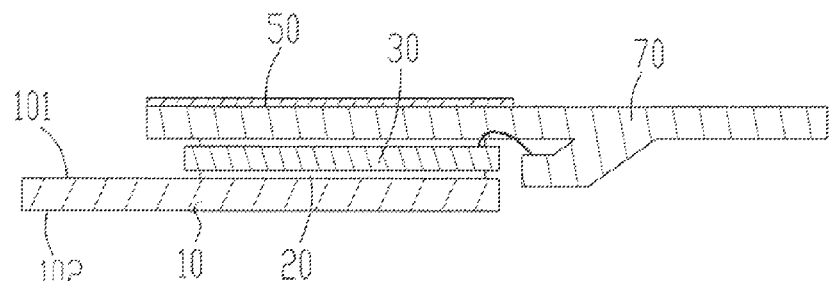
FIG. 7 is an exploded side view of a second embodiment of a semiconductor chip module of a high heat-dissipation chip package structure according to present invention.
Figure 8:
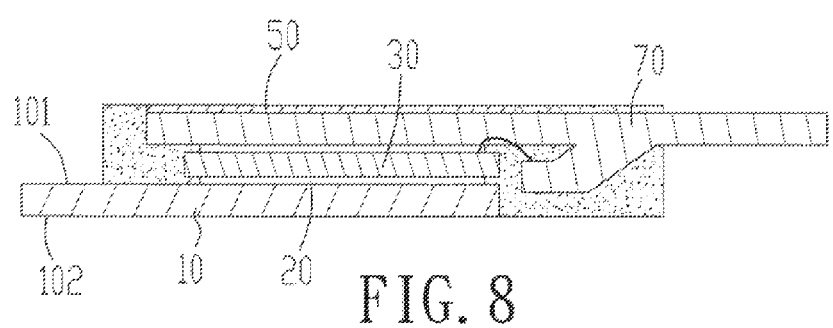
FIG. 8 is an exploded side view of the second embodiment of the semiconductor chip module of the high heat-dissipation chip package structure according to present invention while packaging.
Figure 9:
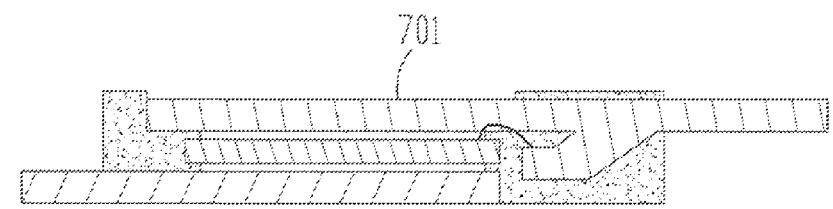
FIG. 9 is an exploded side view of the second embodiment of the semiconductor chip module of the high heat-dissipation chip package structure according to present invention after packaging.
Figure 10:
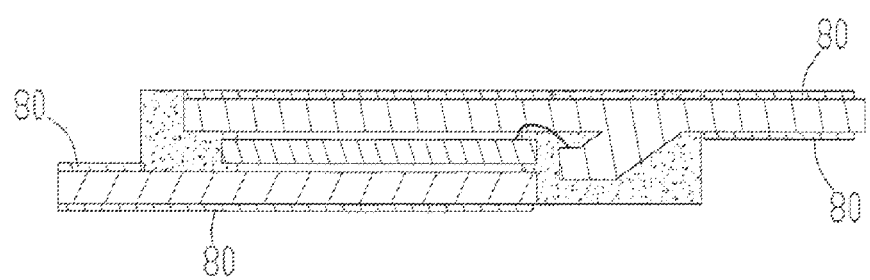
FIG. 10 is an exploded side view of the second embodiment of the high heat-dissipation chip package structure according to present invention after being electroplated by metal.

Please refer to FIGS. 7 to 10, which are shown a second embodiment of the high heat-dissipation chip package structure of the present invention. The high heat-dissipation chip package structure mainly comprises the base 10, the semiconductor chip 30, a heat-dissipation lead frame 70, the connection lead (not shown), the pre-attachment film 50, and the potting compound 60.

The base 10 has the upper surface 101 and the lower surface 102 opposite to each other. The adhesive layer 20 is coated on the upper surface 101 for adhering the semiconductor chip 30.

The bottom part of the semiconductor chip 30 is adhered on the upper surface 101 of the base 10 and the top part of the semiconductor chip 30 is connected with the connection plate 40 via the adhesive layer 20.

The heat-dissipation lead frame 70 is bounded on the semiconductor chip 30 via the adhesive layer 20 for dissipating heat. The connection lead (not shown) is electrically connected with the semiconductor chip 30 and a lead frame portion of the lead frame 70. The pre-attachment film 50 may be adhered on a first surface 401 of the connection plate 40. The connection plate 40 may be made by a metal with good conductivity and heat dissipation and selected from one of gold, silver, copper, and aluminum. The pre-attachment film 50 may be a tearable adhesive film and has a predetermined thickness.

A semiconductor chip set is formed after finishing above fabrication. The semiconductor chip set is poured by the potting compound 60 in a mold so as to be packaged a semiconductor chip module. The pre-attachment film 50 has adhered on an upper part 701 of the heat-dissipation lead frame 70 before packaging and the pre-attachment film 50 is torn off and the potting compound 60 at a location of the pre-attachment film 50 on the upper part 701 of the heat-dissipation lead frame 70 is taken away after packaging so that the location of the upper part 701 of the heat-dissipation lead frame 70 without the potting compound 60 has been exposed and an opening is formed thereof due to the predetermined thickness of the pre-attachment film 50. In order to keep electrical connection and aesthetics of the upper part 701 of the heat-dissipation lead frame 70, the metal layer 80 may be coated on the upper part 701 of the heat-dissipation lead frame 70 so that the semiconductor chip module may be flat and the upper part 701 of the heat-dissipation lead frame 70 may be protected. Simultaneously, the heat-dissipation lead frame 70 or the metal layer 80 is not covered by the potting compound 60 so that the heat of the semiconductor chip module may be dissipated upwardly and downwardly.

Besides, after the semiconductor chip module is finished packaging, the metal layer 80 may be coated on the location of the upper surface 101 and the lower surface 102 of the base 10 without the potting compound 60 to protect the base 10 and keep the effect of heat dissipation.

In summary, compared to the conventional semiconductor chip set after packaging, the high heat-dissipation chip package structure of the present invention may not only simplify the process of cleaning potting compound 60, but also keep the effect of the heat dissipation in the best status.

The foregoing descriptions are merely the exemplified embodiments of the present invention, where the scope of the claim of the present invention is not intended to be limited by the embodiments. Any equivalent embodiments or modifications without departing from the spirit and scope of the present invention are therefore intended to be embraced.

The disclosed structure of the invention has not appeared in the prior art and features efficacy better than the prior structure which is construed to be a novel and creative invention, thereby filing the present application herein subject to the patent law.

What is claimed is:

1. A high heat-dissipation chip package structure, comprising a base, a semiconductor chip, a connection plate, a pre-attachment film, and a potting compound, wherein:
    the base has an upper surface and a lower surface opposite to each other, an adhesive layer is coated on the upper surface for adhering the semiconductor chip on the base;
    a bottom part of the semiconductor chip is adhered on the upper surface of the base via the adhesive layer and a top part of the semiconductor chip is connected with the connection plate via another one adhesive layer;
    the connection plate is electrically connected with the semiconductor chip and a lead frame;
    the pre-attachment film is adhered on the connection plate; and
    a semiconductor chip set is finished fabricating and packaged by the potting compound.

2. The high heat-dissipation chip package structure as claimed in claim 1, wherein the connection plate is made by a metal with good conductivity and heat dissipation and selected from one of gold, silver, copper, and aluminum.

3. The high heat-dissipation chip package structure as claimed in claim 1, wherein the pre-attachment film is a tearable adhesive film and has a predetermined thickness.

4. The high heat-dissipation chip package structure as claimed in claim 1, further comprises a metal layer coated at the location of the pre-attachment film on the connection plate after finishing packaging and tearing the pre-attachment film off.

5. A high heat-dissipation chip package structure, a base, a semiconductor chip, a heat-dissipation lead frame, a connection plate, a pre-attachment film, and a potting compound, wherein:
- the base has an upper surface and a lower surface opposite to each other, an adhesive layer is coated on the upper surface for adhering the semiconductor chip;
- a bottom part of the semiconductor chip is adhered on the upper surface of the base and a top part of the semiconductor chip is connected with the connection plate via the adhesive layer;
- the heat-dissipation lead frame is bounded on the semiconductor chip via the adhesive layer for dissipating heat;
- the connection lead is electrically connected with the semiconductor chip and a lead frame portion of the lead frame;
- the pre-attachment film is adhered on the connection plate; and
- a semiconductor chip set is finished fabricating and packaged by the potting compound.

6. The high heat-dissipation chip package structure as claimed in claim 5, wherein the heat-dissipation lead frame is made by a metal with good conductivity and heat dissipation and selected from one of gold, silver, copper, and aluminum.

7. The high heat-dissipation chip package structure as claimed in claim 5, wherein the pre-attachment film is a tearable adhesive film and has a predetermined thickness.

8. The high heat-dissipation chip package structure as claimed in claim 5, further comprises a metal layer coated at the location of the pre-attachment film on the heat-dissipation lead frame after finishing packaging and tearing the pre-attachment film.

9. The high heat-dissipation chip package structure as claimed in claim 5, further comprises a metal layer coated at a location of the upper surface and the lower surface of the base packaged the potting compound.

* * * * *